(12) United States Patent
Ott

(10) Patent No.: US 6,636,575 B1
(45) Date of Patent: Oct. 21, 2003

(54) CASCADING PLL UNITS FOR ACHIEVING RAPID SYNCHRONIZATION BETWEEN DIGITAL COMMUNICATIONS SYSTEMS

(75) Inventor: Stefan Ott, Munich (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/369,681

(22) Filed: Aug. 5, 1999

(51) Int. Cl.$^7$ .................................................. H03D 3/24
(52) U.S. Cl. ...................... 375/376; 375/371; 375/373; 375/374; 375/375; 375/377; 375/354; 375/282; 375/241; 375/242; 331/1; 331/17; 327/149; 327/150; 341/61; 341/143; 341/144; 341/146; 341/126; 341/128; 341/129
(58) Field of Search ................................ 375/371, 373, 375/378, 282, 241, 242, 354; 331/1, 17; 395/558; 527/149, 150; 341/61, 143, 144, 146, 126, 128, 129

(56) References Cited

FOREIGN PATENT DOCUMENTS

| EP | 0 897 221 A1 | 2/1999 | ............. H03L/7/23 |
|---|---|---|---|
| FR | 2 675 972 | 10/1992 | ............. H04B/7/00 |
| GB | 1 531 632 | 11/1978 | ............. H03B/3/04 |
| GB | 2 084 415 A | 4/1982 | ............. H04L/7/08 |

OTHER PUBLICATIONS

"A Microprocessor–Controlled Phase–locked Signal Source", Radio And Electronic Engineer, vol. 48, No. 12, Dec. 1978, pp 593–602, XP–002082177, London, England.*
Patent Abstracts of Japan vol. 012, No. 244 (E–631), Jul. 9, 1988 & JP 63031314 (Toshiba Corp.), Feb. 10, 1988 abstract.

* cited by examiner

Primary Examiner—Stephen Chin
Assistant Examiner—Guillermo Munoz
(74) Attorney, Agent, or Firm—Peter Zawilski

(57) ABSTRACT

A clock synchronization system for synchronizing a first communications device and a second communications device to enable digital communication there between. A first device generates a first clock signal Fa. A second device generates a second clock signal Fb2. The second device includes a first PLL circuit and a second PLL circuit. The first PLL circuit is adapted to increase Fa by a factor K to produce a signal Fak. The second PLL circuit is adapted to increase Fak by a factor L to produce a signal Fbn. The second PLL circuit is further adapted to decrease Fbn by a factor N to produce the signal Fb2. The first PLL circuit and the second PLL circuit are adapted to adjust the values of K, L, and N such that a frequency lock is achieved between Fa and Fb2. enabling digital communication between the first device and the second device without requiring a predetermined phase lock between Fa and Fb2.

17 Claims, 7 Drawing Sheets

CASCADING PLL UNITS FOR ACHIEVING RAPID SYNCHRONIZATION BETWEEN DIGITAL COMMUNICATIONS SYSTEMS

TECHNICAL FIELD

The present invention relates generally to digital information systems. More particularly, the present invention relates to a method and system for rapidly synchronizing two or more digital communications systems.

BACKGROUND ART

The transmission of digital information and data between systems has become an essential part of commonly used systems. With such systems, information content is transmitted and received in digital form as opposed to analog form. Information long associated with analog transmission techniques, for example, television, telephone, music, and other forms of audio and video, are now being transmitted and received in digital form. The digital form of the information allows signal processing techniques not practical with analog signals. In most applications, the user has no perception of the digital nature of the information being received.

Traditional modes of communication often occur in "real time." For example, a telephone conversation occurs in real time. A "live" television sports broadcast occurs in real time. Users have come to expect these and other such traditional forms of communication to be in real time. Thus, digital transmission and reception techniques and systems need to provide for the real time transmission and reception of information.

There is a problem, however, in that digital communication between devices distant from each other usually precludes the availability of identical sampling frequencies. Except for those cases where a distinct clocking hierarchy structure can be defined and a common distributed clock source employed, there will be some difference between the sample rate of one device (e.g., the transmitter) and the sample rate of the other device (e.g., the receiver).

Prior Art FIG. 1 shows a typical prior art digital information transmission and reception system 100. In system 100, a signal source 101, for example, a video camera, generates an analog input signal. The input signal is coupled to a sampler-ADC (analog to digital converter) 102, where it is sampled and encoded into a digital pulse code modulated signal. This signal is transmitted across a transmission link to a sampler 103. Sampler 103 is coupled to a DAC (digital to analog converter) reconstruction filter 104. The sampler 103 samples the pulse code modulated signal received via the transmission link. The sampling creates a digital signal, which is subsequently coupled to the DAC-reconstruction filter where it is decoded and filtered into an output signal. The output signal represents the input signal from signal source 101.

To maintain synchronization between the devices on either side of the communications link, sophisticated synchronization technology has been developed. In most instances, the synchronization technology functions adequately. Consequently, digital communications systems (e.g., digital television, digital telephony, etc.) have proliferated and become widely accepted. The synchronization performance obtainable with conventional, prior art synchronization technology is sufficient to allow most applications (e.g., digital television) to function as intended.

Prior Art FIG. 2 shows a digital communications system 200 employing a typical prior art synchronization scheme. System 200 includes a transmitting device 201 sending a data signal to a receiving device 202. Transmitting device 201 provides a transmitter clock signal to a phase comparison circuit, phase locked loop (PLL) 203. PLL 203 generates a voltage output, $V_{out}$, which is coupled to a VCO (voltage controlled oscillator) 205. $V_{out}$ controls the frequency of a clock signal, CLOCK A, generated by VCO 205. CLOCK A is coupled to a frequency divider 204, where it is divided, typically by some large integer factor, to produce a clock signal CLOCK B. PLL 203 compares the phase of CLOCK B and the transmitter clock and adjusts $V_{out}$ until CLOCK B and the transmitter clock are in phase.

When the transmitter clock and CLOCK B are in phase, PLL 203 supplies a lock indication signal to receiving device 202, informing the device it can now reliably use CLOCK B to sample the DATA signal from transmitting device 201. Only after this time (e.g., phase lock) can reliable communication occur.

It should be noted that the receiving device 202, as with most digital communications systems, is able to adjust its clock frequencies within a certain range "$F_w$" about a nominal frequency "$F_o$", at a certain rate. When communication is initiated between the transmitter device 201 and the receiving device 202, the initial phase difference between the transmitter clock and the receiver clock can be any value within a range of zero degrees to 180 degrees. Hence, based upon the rate at which the frequency and phase can be adjusted, and based upon the size of the range, system 200 will require a significant amount of time to acquire phase lock.

For example, in case where system 200 is a DECT (Digital Enhanced Cordless Telephony) system connected to an ISDN central office branch where the transmitter clock frequency=8 kHz and $(F_w/F_o)=10^{-5}$, phase lock time may run up to seven seconds. Phase lock time can increase even more significantly if the transmitter clock frequency or the receiver clock frequency (e.g., CLOCK B) deviates from $F_o$. Acquiring phase lock requires that the CLOCK B signal be tuned to deviate as much as possible from the transmitter clock frequency so that the phases of both frequencies approach each other as fast as possible, with CLOCK B being slowly adjusted by PLL 203 and VCO 205. This resembles two trucks on an uphill highway trying to catch up with each other, having the same engine horsepower.

Referring still to system 200 of FIG. 2, frequency synchronization between the transmitting device 201 and the receiving device 202 is achieved by synchronizing the phase of both devices with the phase of PLL 203. This method is well known and widely used in the art, and results in achieving synchronicity both in frequency and phase between the transmitting device 201 and receiving device 202.

Given the fact that two communication devices, transmitting device 201 and receiving device 202, can adjust their respective clock rates within a certain narrow window, and there is an initial phase difference between their clock signals, one can calculate the minimum time required for the worst case synchronization (for example, where the transmitter clock signal and the receiver device clock signal CLOCK B are initially 180° out of phase). For a DECT system, where $F_o$ is 8 kHz and $F_w$ is approximately $10^{-5}$ (=10 ppm), phase lock time may run up to 6.5 seconds. Lock time can increase significantly if the transmitter clock signal or the receiver device clock signal deviate from $F_o$. Worst-case lock time (still assuming the transmitter clock and receiver clock are at $F_o$) can be calculated from the cycle duration of the transmitter clock or the receiver clock, the startup phase difference $P_{do}$=62.5 μs, and the maximum possible cycle duration difference $10^{-5}/F_A$=1.25 ns between $F_A$ and $F_B$ (where $F_A$ and $F_B$, are the transmitter clock and receiver clock, respectively). Acquiring phase lock requires that one of the two frequencies ($F_A$ or $F_B$) be tuned to deviate as much as possible from the other so that the phases of both frequencies approach each other as fast as possible. The initial phase difference of $P_{do}$=62.5 μs is thereby decreased in steps of approximately 1.25 ns per cycle of $F_A$, taking ~50,000 cycles of $F_A$, equivalent to ~6.25 seconds plus the implementation loss of the phase-lock-loop circuit PLL.

Synchronization has to be achieved each time the phone rings before useful communication can start. In system 200, phase lock has to be achieved each time the phone rings before useful communication can start. Prior to synchronization, no reliable communication can be established between the two digital telephone devices. Moreover, in some digital telephone devices, the device's specifications may even require that its communications circuits be disabled during synchronization acquisition (e.g., before a stable lock condition is achieved) because frequencies may be out of their specified range during that time.

This presents an increasingly problematic situation, in that the majority of the more modern communications devices rely upon connections that are frequently established and released and tuning ranges $F_w$, are reduced. The communications link is established as needed, as rapidly as possible, and subsequently released as rapidly as possible when no longer needed (e.g., in order best to conserve frequency bandwidth, to achieve high system utilization rates, to serve more customers, and the like).

Thus, what is required is a system for digital transmission which overcomes the slow synchronization limitations of the prior art. The required system should provide for digital transmission and reception systems which achieve rapid frequency lock. The required system should be capable of rapidly establishing a stable communications link as needed. The present invention provides a novel solution to these requirements.

DISCLOSURE OF THE INVENTION

The present invention provides a method and system for digital transmission which overcomes the slow synchronization limitations of the prior art. The system of the present invention provides a method and system for digital transmission and reception systems which achieve rapid frequency lock. The system of the present invention is capable of rapidly establishing a stable communications link as needed.

In one embodiment, the present invention is implemented in a DECT telephone system as a clock synchronization system for synchronizing a first communications device (e.g., a digital private branch exchange (PBX) or central office) and a second communications device (e.g., a digital phone) to enable digital communication there between. The first device generates a first clock signal Fa. The second device generates a second clock signal Fb2. The second device includes a first PLL circuit and a second PLL circuit. The first PLL circuit is adapted to increase Fa by a factor K to produce a signal Fak. The second PLL circuit is adapted to increase Fak by a factor L to produce a signal Fbn. The second PLL circuit is further adapted to decrease Fbn by a factor N to produce the signal Fb2. The first PLL circuit and the second PLL circuit are designed using the values of K, L, and N such that a frequency lock is achieved between Fa and Fb2, thus enabling digital communication between the first device and the second device without requiring a phase lock between Fa and Fb2. In this manner, the system of the present invention achieves rapid synchronization between the first and second devices.

The present invention provides its advantages by utilizing the fact that for most digital communication systems applications, it is not necessary to actually achieve a zero degree phase lock. It is sufficient to have a precise frequency lock while the phase may be arbitrary, provided that the phase does not drift over time. The fact that synchronization, and hence communication, can be achieved with merely a frequency lock as opposed to a phase lock is a key attribute exploited by the system of the present invention. Achieving a phase lock requires considerably more time than achieving a frequency lock. By optimizing its design to achieve frequency lock, the system the present invention provides a much more rapid synchronization than possible with prior art systems.

BRIEF DESCRIPTION OF THE DRAWINGS

The accompanying drawings, which are incorporated in and form part of this specification, illustrate embodiments of the invention and, together with the description, serve to explain the principles of the invention.

Prior Art

Prior Art

BEST MODE FOR CARRYING OUT THE INVENTION

Reference will now be made in detail to the preferred embodiments of the invention, a method and system for rapidly achieving synchronization between digital communications systems, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not unnecessarily to obscure aspects of the present invention.

The present invention provides a method and system for digital transmission which overcomes the slow synchronization limitations of the prior art. The system of the present invention provides a method and system for digital transmission and reception systems which achieve rapid frequency lock. The system of the present invention is capable of rapidly establishing a stable communications link as needed. The present invention provides its advantages by utilizing the fact that for most digital communication systems applications, it is not necessary to actually achieve a zero degree phase lock. Stable, glitch-free communication can be provided by establishing a precise frequency lock, while the phase differential between the two devices (e.g., the transmitting device and the receiving device) may be arbitrary, provided that the phase does not drift over time. The method and system of the present invention is optimized to achieve a very rapid, high precision frequency lock, thereby providing a much more rapid synchronization than possible with prior art systems. The present invention and its benefits are further described below.

Figure 1:
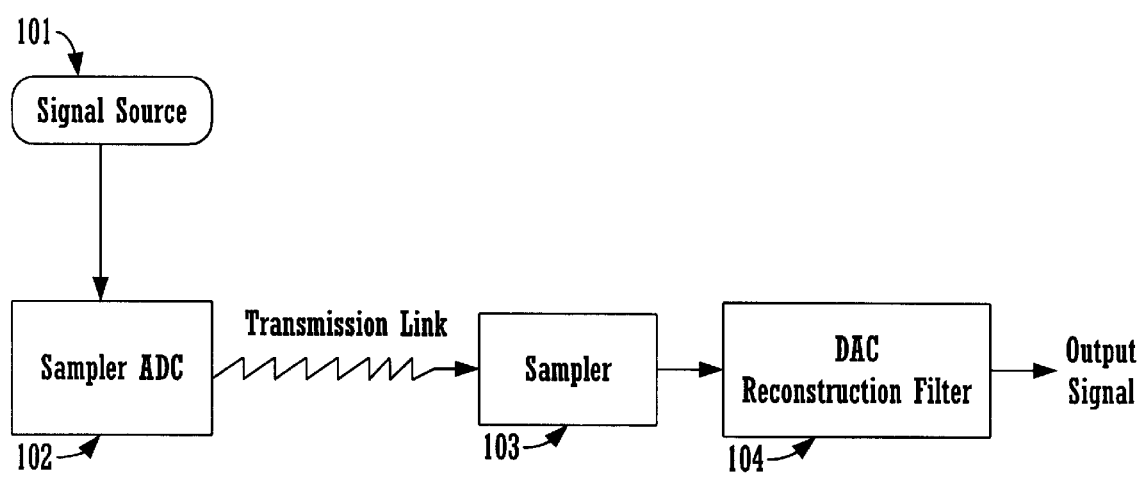
FIG. 1 shows a typical prior art digital communications system.
Figure 2:
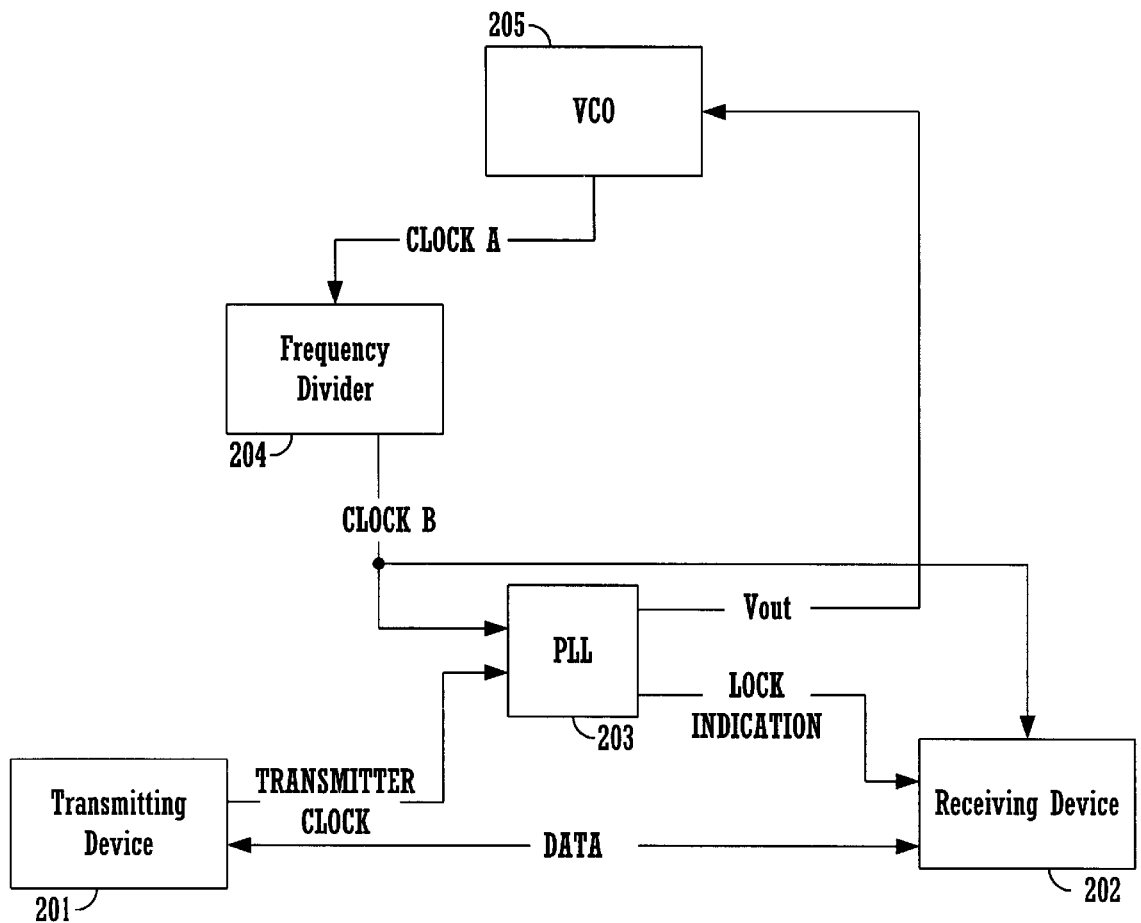
FIG. 2 shows a block diagram of a digital communications system using a typical prior art phase synchronization scheme.
Figure 3:
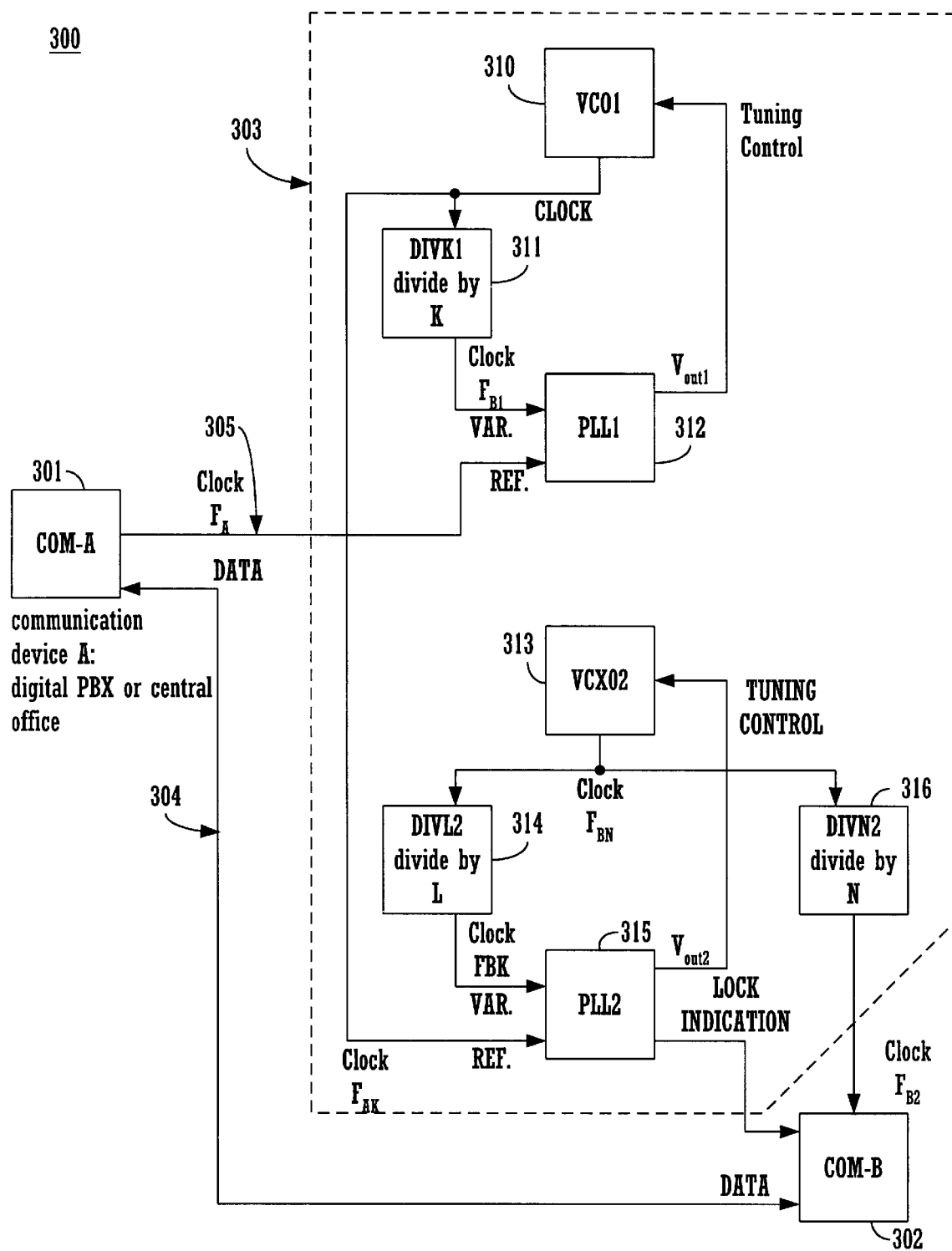
FIG. 3 shows a block diagram of a digital communications system in accordance with one embodiment of the present invention.

Referring now to FIG. 3, a block diagram of a digital communications system 300 in accordance with one embodiment of the present invention is shown. A first digital communications device, COM-A 301, is shown on the left side of FIG. 3. COM-A 301 communicates with a second digital communications device, COM-B 302, on the right side of FIG. 3. COM A 301 and COM B 302 communicate via a data channel, represented by line 304. A clock signal, CLOCK FA, is transmitted from COM-A 301 on a separate channel 305. CLOCK FA enables the DATA signal to be sampled and the communications information to be recovered therefrom. CLOCK FA is coupled to a synchronization circuit 303. Synchronization circuit 303, as shown in the dotted area of FIG. 3, includes a number of components (e.g., components 310 through 316). Synchronization circuit 303 functions in part by providing a synchronized clock signal, CLOCK Fb2, and a lock indication signal, LOCK INDICATION, to COM B 302.

Synchronization circuit 303 includes components 310 through 316. Clock FA is coupled as a reference clock signal to a first PLL 312. PLL 312 generates a voltage output, Vout1, and couples this output to a VCO 310 as a tuning control signal. VCO 310 generates an output clock signal, CLOCK Fak, and couples this signal to a divider 311 and as a reference clock signal to a second PLL 315. Divider 311 (e.g.,DIVK1) functions by dividing CLOCK Fak by an integer factor K, producing a clock signal CLOCK Fb1, and coupling this resulting signal to the VAR input of PLL 312.

Thus, components 310 through 312 function as a first PLL circuit that effectively multiplies CLOCK FA by the integer factor K. PLL 312 adjusts Vout1 to achieve a phase lock between CLOCK Fb1 and CLOCK FA, thereby achieving a frequency lock between CLOCK Fak and CLOCK FA.

Synchronization circuit 300 also includes components 313 through 316. As described above, the signal clock Fak is received by PLL 315 as a reference signal. PLL 315 generates a voltage output, Vout2, and couples this output to a voltage controlled crystal oscillator (VCXO) 313 (VCXO2) as a tuning control signal. VCXO 313 generates an output clock signal, CLOCK Fbn, and couples this signal to a divider 314 (DIVL2) and a divider 316 (DIVN2). Divider 314 is operable to divide CLOCK Fbn by an integer factor L. Divider 316 is operable to divide CLOCK Fbn by an integer factor N. The output of divider 314 is coupled to the VAR input of PLL 315. The output of divider 316 is coupled to COM-B 302 as the synchronized clock signal CLOCK Fb2.

Thus, components 313 through 316 function in part as a second PLL circuit that multiplies CLOCK Fak by the integer factor L and divides the resulting signal by the integer factor N, to obtain the synchronized clock signal CLOCK Fb2. In this manner, synchronization circuit 303 provides a synchronized clock signal (CLOCK Fb2) to the receiver device COM-B 302 which is precisely frequency locked with the clock signal of the transmitter device (CLOCK FA). PLL 315 further provides a lock indication signal (LOCK INDICATION) to the receiving device, COM-B 302, that indicates when the precise frequency lock has been achieved.

Referring still to FIG. 3, in accordance with the present invention, it should be appreciated that achieving phase lock is not required for communication between COM-A 301 and COM-B 302. All that is required is that the absolute value of the initial phase difference between COM-A 301 and COM-B 302 is kept reasonably constant throughout the entire connection, and that frequency lock is achieved. Since frequency lock can be achieved virtually instantaneously by tuning CLOCK Fb2 to CLOCK FA, the time to achieve lock is reduced significantly by the method of the present invention.

With prior art synchronization schemes, it is has been shown that lock time depends mainly on the comparison frequency (e.g., CLOCK FA) and the tuning range of an incorporated VCXO. If the comparison frequency could be increased, for example by a factor of 100, it would still take 50,000 cycles of this increased comparison frequency to achieve phase lock, but it would obviously take only $1/100^{th}$ of the time it took before the increase.

Thus, in accordance with the present embodiment, the comparison frequency (e.g., CLOCK FA) is increased by a factor of K to reduce lock time using a first PLL circuit (e.g., components 310 through 312) having a PLL (e.g., PLL 312) with a highly agile VCO (e.g., VCO 310) with a wide tuning range. The resulting frequency, CLOCK Fak, is then further stepped up by a factor of L using a second PLL circuit (e.g., components 313 through 316) having a PLL (e.g., PLL 315) with a VCXO (e.g., VCXO 313) producing a frequency $F_{BN}$ (CLOCK Fbn) having a narrow tuning range as dictated by the communication system interface specifications.

In accordance with the present embodiment, L is chosen so that K=·L=N and CLOCK FA·K·L=CLOCK $F_{AK}$·L= CLOCK Fb2. Divider 311, VCO 310, and PLL 312 increase the comparison frequency for PLL 315 (e.g., CLOCK FA) by the integer factor K, thereby decreasing the lock time for PLL 315 by the factor K. The signal CLOCK Fbn, produced by the VCXO 313, and divider 316 then produce the desired frequency locked signal CLOCK Fb2 for the receiving device, COM-B 302.

In accordance with the present embodiment, both PLL 312 and PLL 315 employ well-known, standard techniques and components, and can therefore be easily developed and built cost effectively. PLL 312 uses a phase-frequency detector to achieve fast and secure lock even with the wide tuning range of VCO 310. PLL 315 uses an EXOR or J-K-Flipflop phase detector to ensure that the VCXO 313 coupled to PLL 315 operates near its center frequency (e.g., CLOCK Fbn) even when the VCO 310 output frequency coupled to PLL 312 is out of the lock range of PLL 315. This is to ensure that PLL 315 will not be influenced even when CLOCK FA is missing and CLOCK Fak is invalid. Undesirable influence on PLL 315 is avoidable if the output of frequency of VCO 310 (e.g., CLOCK Fak) is sufficiently far out of the lock range of PLL 315. In the present embodiment, a deviation of ±0.5 . . . 2% is suggested.

It should be noted that the above undesirable influence of CLOCK Fak on PLL 315 also depends on the loop filter bandwidth of PLL 315.

Figure 5:
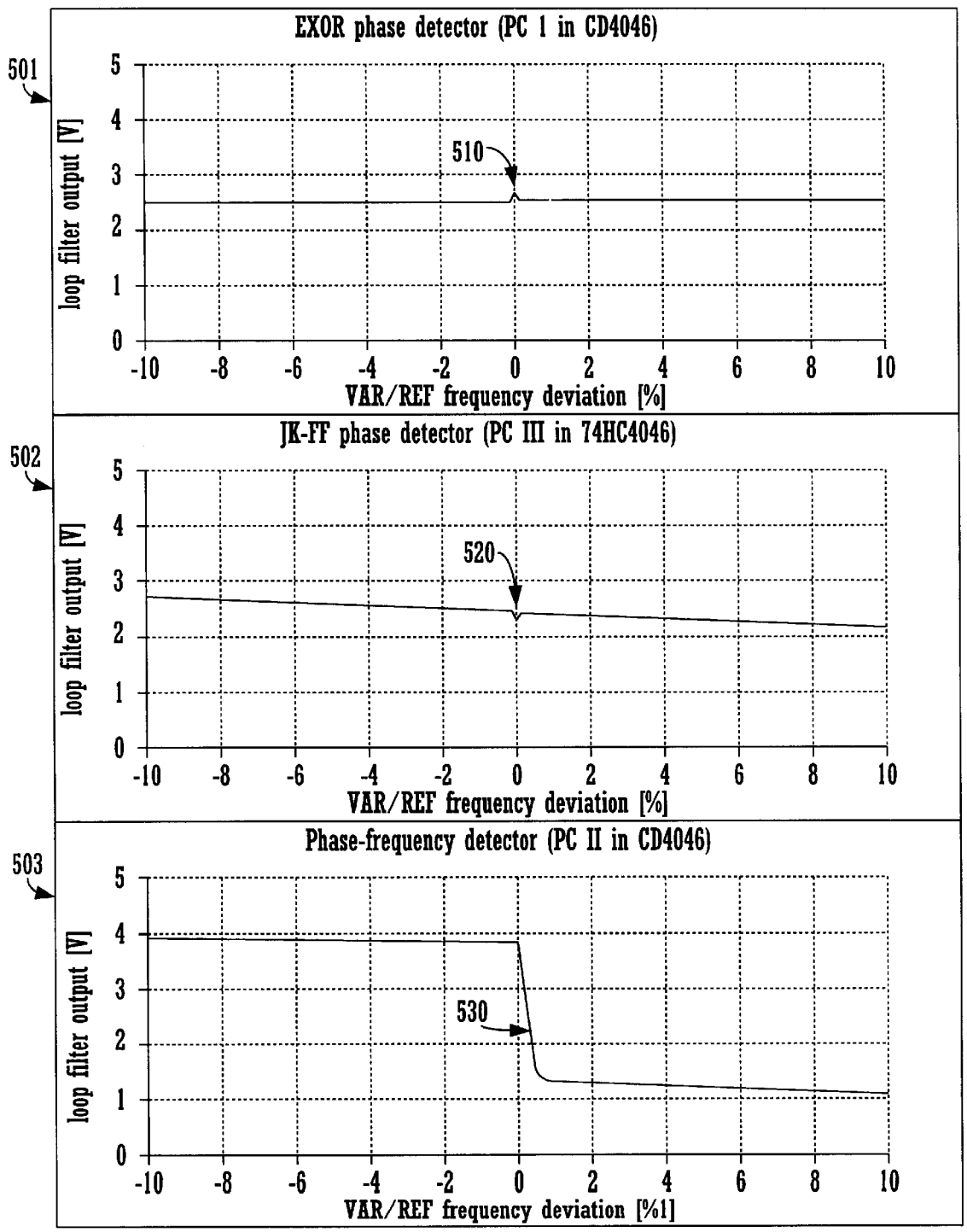
FIG. 5 shows a series of graphs of simulated performance results of a synchronization system in accordance with one embodiment of the present invention.
Figure 6:
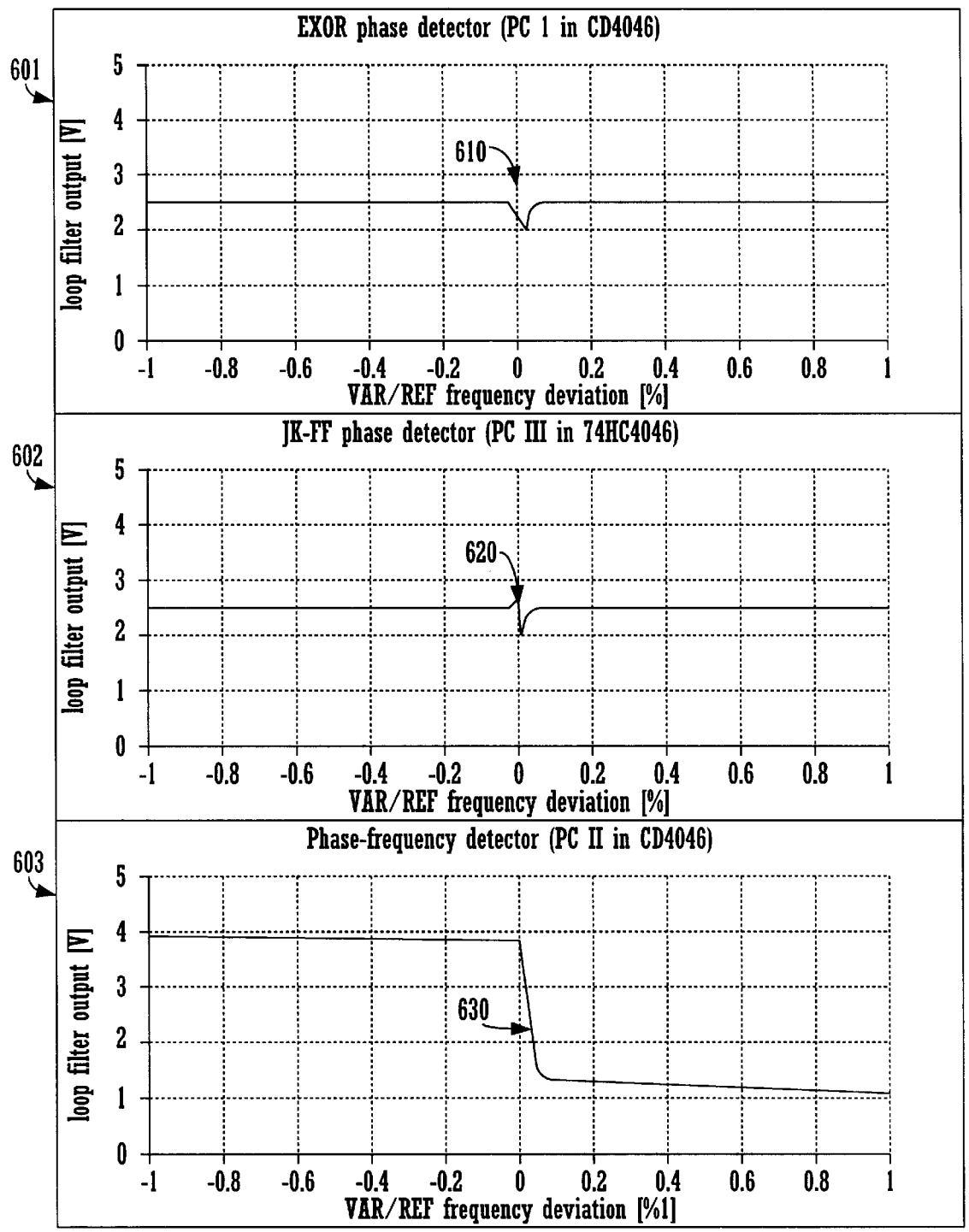
FIG. 6 shows a second series of graphs of simulated performance results of a synchronization system in accordance with one embodiment of the present invention.

FIGS. 5, 6, below show simulation results for various phase comparator types fed with two different transmitter device clock frequencies to show the criteria for the selection of the type of phase detector for incorporation into PLL 315.

Referring still to system 300 of FIG. 3, it should be further noted that, for clarity, synchronization circuit 303 is discussed as having integer values for the divider factors (e.g., the factors K, L, and N for dividers 311, 314, and 316 respectively), however, it should be understood that non-integer values can also be used for the factors K, L, and N by using standard techniques, such as, for example, multi-modulus pres-calers and fractional-N synthesizers.

Specifically, in the present embodiment, the factor values are as follows: N=3456, CLOCK FA=8 kHz, K=216, CLOCK Fak=1.728 MHz, L=16, and CLOCK Fbn=27.648 MHz. Lock time is approximately 50 ms for PLL 312, and approximately 30 ms for PLL 315. Overall lock time of synchronization circuit 303 is therefore around 100 ms. This compares favorably with a typical lock time for a typical prior art circuit, around 6250 ms or longer.

The VCO 310 output frequency range can be described by CLOCK Fak=K·CLOCK FA·(1±[1 . . . 2]·$10^{-2}$).

The VCXO 313 output frequency range can be described by CLOCK Fbn=N·CLOCK Fb2=L·CLOCK Fbk=N·$F_o$·(1±$10^{-5}$).

After lock is achieved, CLOCK Fb2=L·CLOCK Fbk/N= L·CLOCK Fak/N=K·CLOCK Fb1/N=K·L·CLOCK FA/N= CLOCK FA.

It should be noted that although system 300 will achieve phase lock very quickly, no phase jumps will be seen at CLOCK Fb2. This is a very important feature and provides a significant advantage for the uninterrupted operation of system 300, even during phase acquisition of, for example, a digital radio link. Only slight frequency variations within the permissible range of the system specification will occur, and they will disappear once the lock condition is reached. In accordance with the present invention, when both PLLs 312 and 315 have locked, signal CLOCK Fb2 is clean, having a constant phase difference with respect to CLOCK FA.

Figure 4:
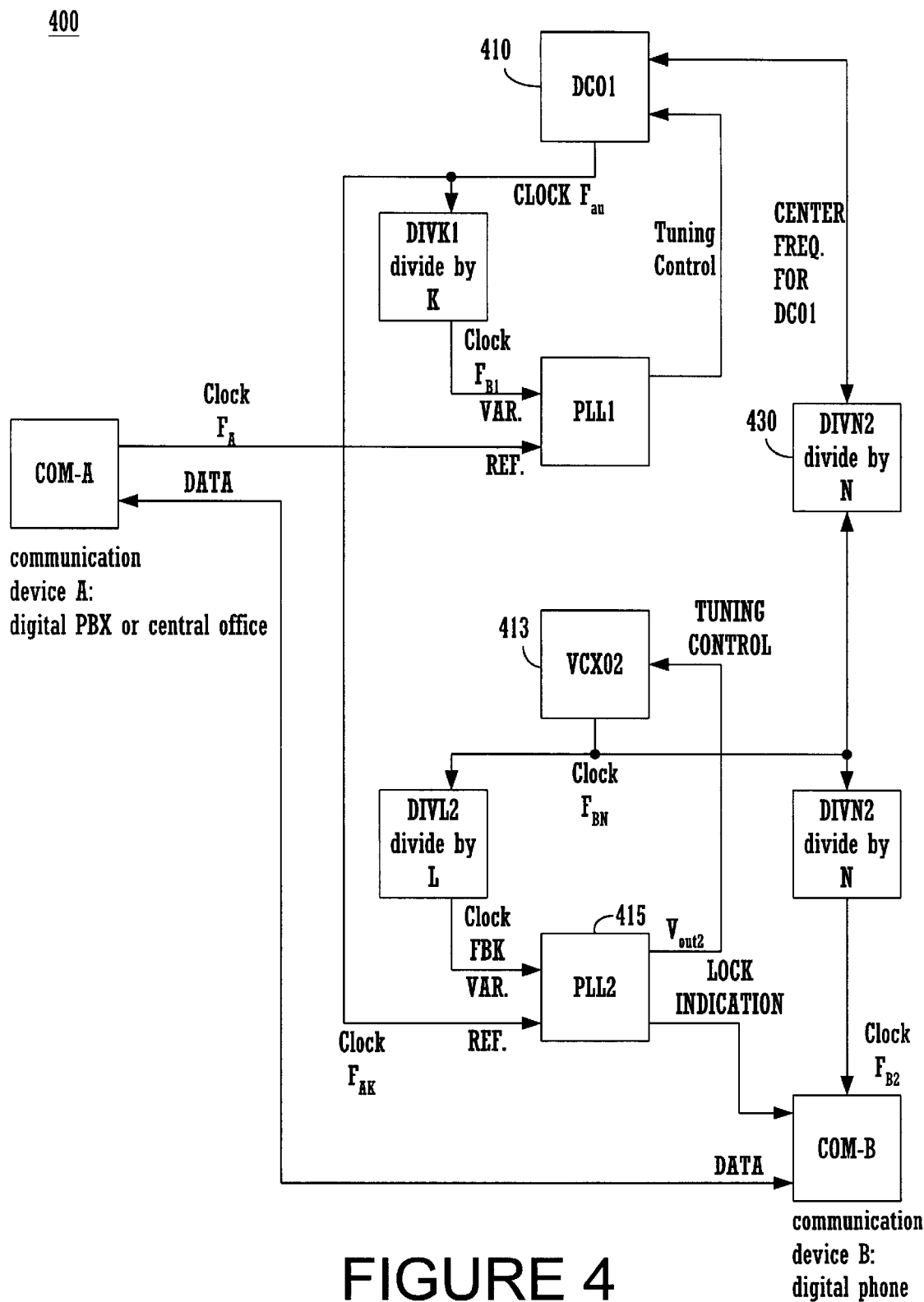
FIG. 4 shows a block diagram of a digital communications system in accordance with one alternative embodiment of the present invention.

With reference now to FIG. 4, a system 400 in accordance with an alternate embodiment of the present invention is shown. System 400 is substantially similar to system 300 of FIG. 3., however, system 400 is an all digital implementation while system 300 is primarily an analog implementation (e.g., for PLL 312/VCO 310). Thus, system 400 shows that the present invention is not limited solely to analog or digital components for its implementation. For clarity, system 400 shows the basic components needed to understand the invention.

As it may be difficult, disadvantageous or expensive to build an analog VCO (e.g., VCO 310 of FIG. 3) with precise center frequency and tuning range, the embodiment of system 400 is shown in order to illustrate an all digital implementation. System 400 shows an all digital PLL (ADPLL) implementation variant. The ADPLL building blocks and their characteristics are well known in the art, and inexpensive, standard parts are commonly available. To show the difference, the equivalent VCO from system 300 (e.g., VCO 310) has been renamed to DCO1 410 in system 400 to reflect its digital nature. The center frequency of DCO1 410 is derived from VCXO 413 through division by a factor of M in divider 430. DCO1 410 output frequency, CLOCK Fak, can be described by: CLOCK Fak=CLOCK Fbn/M·(3+C)/6, where C∈{−1, 0, +1; and is redetermined once in every cycle of CLOCK FA.

It should be noted that in system 400, changes in the value of C are unavoidable, but lead to undesired spurious appearing on signal CLOCK Fak. Although spurious signals are unavoidable, their power spectrum density distribution can be influenced by choosing the value for M. For example, M=L/2 would yield the desired center frequency for DCO1 410, but the spurious signals would have most of their energy very close to the output frequency, leading to spurious signals even at VCXO 413 CLOCK Fbn. Thus, in the present embodiment, the value of M is modified so that the spurious signals on signal CLOCK Fak are moved away from the center of the output frequency and can be filtered out as they will not pass through the loop filter of VCXO 313 coupled to PLL 415. According to the above equation, the factor M can be modified by up to 30% in each direction, thereby moving the spurious signals more than 500 kHz away from the desired frequency.

For additional discussions of rapid synchronization and system implementations, the reader is referred to Stefan Ott, "A METHOD AND SYSTEM FOR RAPIDLY ACHIEVING SYNCHRONIZATION BETWEEN DIGITAL COMMUNICATIONS SYSTEMS", a U.S. patent application Ser. No. 09/046,890 filed on 03/23/98, which is incorporated herein by reference. The present invention provides the advantage of being implemented (e.g., system 300 of FIG. 3 or system 400 of FIG. 4) with standard, inexpensive components as opposed to requiring programmable logic devices (PLDs, LCAs, FPGAs, etc.) or custom ASICs (application specific integrated circuits).

FIG. 5 shows a series of graphs of the DC component of the output of PLL 415 (e.g., Vout2) of system 400. As described above, the output of PLL 415 adjusts the frequency of CLOCK Fbk produced by VCXO 413. The graphs 501, 502, and 503 show the results of a simulation of the operation of system 400, specifically, the filtered, DC component of Vout2, as produced by an optimal PLL component (e.g., graphs 501 and 502) and a non-optimal component (e.g., graph 503). For each of graphs 501–503, amplitude of Vout2 is depicted in the vertical axis and VAR/REF frequency deviation is depicted in the horizontal axis. Graph 501 shows the case where PLL 415 is implemented using an EXOR phase detector (PC I in CD4046). Graph 502 shows the case where PLL 415 is implemented using a JK-FF phase detector (PC III in 74HC4046). Graph 503 shows the case where PLL 415 is implemented using a Phase-frequency detector (PC II in CD4046). It should be noted that graphs 501–503 can also be interpreted to reflect the results of PLL 315 of FIG. 3, since PLL 315 and PLL 415 are substantially similar in their operation and implementation in systems 300 and 400.

In the present embodiment, it is very desirable to select a PLL component, for the implementation of PLL 415, that has a very "flat" output over input frequency deviations. To maintain stability of CLOCK Fb2, Vout2 should be as flat as possible, even when in an unlock condition. Graphs 501 and 502 show simulation results for a proper implementation. The discontinuity 510, 520, and 530 show the sensitivity to frequency differences. In graphs 501 and 502, Vout2 is substantially flat for larger frequency deviations, as required for optimal operation of systems 300 and 400. As shown in graphs 501 and 502, Vout2 should remain around the center of its range even for large frequency deviation. However, in graph 503, Vout is very different for negative and positive deviations, resulting in sub-optimal performance of system 400. Accordingly, this type of Phase-frequency detector should not be used for PLL 315 or 415.

FIG. 6 shows a second series of graphs of the DC component of the output of PLL 415. Graphs 601, 602, and 603 are merely higher resolution versions (e.g., "zoomed in"), with respect to % deviation, of graphs 501, 502, and 503 of FIG. 5. They show the relative flatness of Vout2 in greater detail for each implementation of PLL 415 (as shown by the units of measurement for the horizontal axis).

Figure 7:
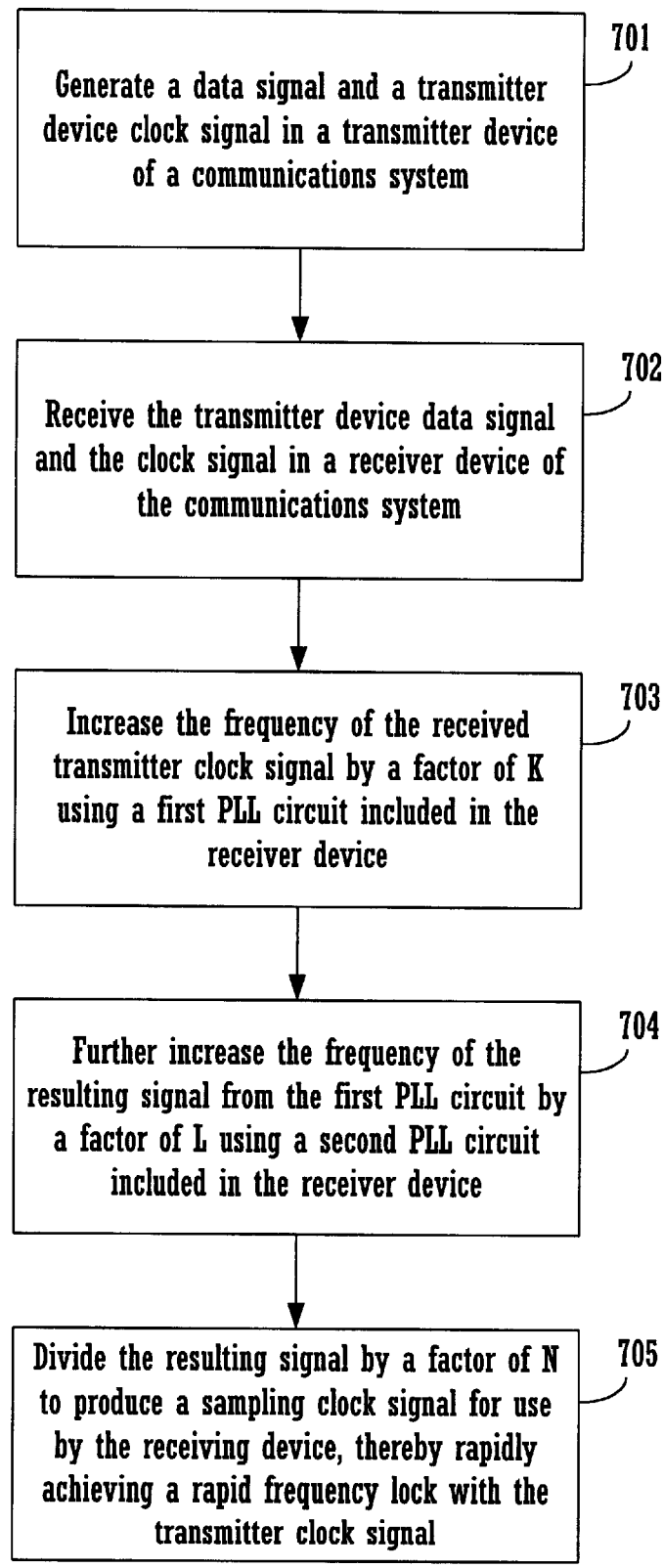
FIG. 7 shows a flow chart of the steps of a synchronization process in accordance with one embodiment of the present invention.

With reference now to FIG. 7, a flow chart of the steps of a process 700 in accordance with one embodiment of the present invention is shown. Process 700 shows the steps of the operating process of a communications system (e.g., system 300 of FIG. 3), including a transmitting device and a receiving device, in accordance with the present invention (e.g., as implemented in a DECT telephony system).

Process 700 begins in step 701, where a transmitting device (e.g., COM-A 301) generates a data signal for transmission to a receiving device (e.g., COM-B 302) and generates a corresponding clock signal (e.g., CLOCK FA) for sampling the data signal. As described above, a typical implementation would be a DECT telephone system as a clock synchronization system for synchronizing a first communications device (e.g., a digital PBX or central office) and a second communications device (e.g., a digital phone) to enable digital communication there between.

In step 702, the data signal is received by the receiving device and the transmitter clock signal is received by a synchronization circuit built into the receiving device (e.g., synchronization circuit 303). As described above, in a typical implementation, the synchronization circuit is included within the receiving device.

In step 703, the frequency of the received transmitter clock signal is increased by a factor of K using a first PLL circuit (e.g., components 310–312 of FIG. 3). The factor K is used to multiply the frequency of the transmitter clock signal using a coupled frequency divider (e.g., divider 311).

In step 704, the output clock signal of the first PLL circuit (e.g., CLOCK Fak) is further increased by a factor L using a second PLL circuit (e.g., components 313–316 of FIG. 3). The second PLL circuit includes a VCXO for producing this signal (e.g., VCXO 313). The resulting signal is equivalent to the transmitter clock signal multiplied by K and L (e.g., CLOCK Fbn).

In step 705, the output of the VCXO (e.g., CLOCK Fbn) is divided by a factor of N using another divider (e.g., divider 316) included in the second PLL circuit. This yields the sampling clock signal (e.g., CLOCK Fb2) for use by the receiver device. As described above, the first PLL circuit and the second PLL circuit are adapted to adjust the values of K, L, and N such that a frequency lock is achieved between the transmitter clock signal and the receiver clock, thus, enabling digital communication between the first device and the second device without requiring a phase lock between the transmitter clock and the receiver clock. In this manner, the system of the present invention achieves rapid synchronization between the first and second devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed:

1. A clock synchronization system for synchronizing a first communications device and a second communications device to enable digital communication therebetween, comprising:

a first device generating a first clock signal Fa;

a second device generating a second clock signal Fb2;

the second device including a first phase locked loop (PLL) circuit and a second PLL circuit, the first PLL circuit adapted to increase the clock signal Fa by a factor K to produce a clock signal Fak, the second PLL circuit adapted to increase the clock signal Fak by a factor L to produce a clock signal Fbn, the second PLL circuit further adapted to decrease the clock signal Fbn by a factor N to produce the clock signal Fb2; and the first PLL circuit and the second PLL circuit adapted to adjust the values of K, L, and N such that a frequency lock is achieved between Fa and Fb2, enabling digital communication between the first device and the second device without requiring a predetermined phase lock between the clock signal Fa and the clock signal Fb2;

wherein the first PLL circuit includes a first PLL having a wide tuning range and adapted to achieve a fast frequency lock.

2. The system of claim 1, wherein the second PLL circuit includes a second PLL having a narrow tuning range and adapted to achieve a frequency lock between the clock signals Fak and Fbk.

3. The system of claim 2, wherein the first PLL is cascaded with the second PLL to step up clock signal Fa to an intermediate clock signal Fak using the first PLL and achieve phase and frequency lock on the clock signal Fak using the second PLL, the first PLL further operable as an agile, wide-range PLL, the second PLL further operable as a stable, narrow-range PLL.

4. The system of claim 2, wherein the second PLL circuit includes a voltage controlled crystal oscillator (VCXO) operable to produce the clock signal Fak, wherein the VCXO is configured to have a nominal frequency for the clock signal Fak within proscribed DECT (digital enhanced cordless telephony) specifications.

5. The system of claim 2, wherein the first device is a central office digital private branch exchange (PBX) and the second device is a digital telephone.

6. The system of claim 2, wherein the clock synchronization system uses values for the factors K, L, and N, such that the clock signal Fa multiplied by K multiplied by L is equal to the clock signal Fak multiplied by L, and which is equal to the clock signal Fb2.

7. The system of claim 2, wherein the second PLL is configured such that phase disturbances on the clock signal Fb2 are eliminated.

8. In a digital communications system including a transmitting device and a receiving device, a clock synchronization system for synchronizing a clock signal from the transmitting device with a clock signal in the receiving device, comprising:

a transmitting device generating a first clock signal Fa;

a receiving device generating a second clock signal Fb2;

the receiving device including a first phase locked loop (PLL) circuit and a second PLL circuit, the first PLL circuit adapted to increase the clock signal Fa by a factor K to produce a clock signal Fak, the second PLL circuit adapted to increase the clock signal Fak by a factor L to produce a clock signal Fbn, the second PLL circuit further adapted to decrease the clock signal Fbn by a factor N to produce the clock signal Fb2; and the first PLL circuit and the second PLL circuit adapted to adjust the values of K, L, and N such that a frequency lock is achieved between Fa and Fb2, enabling digital communication between the transmitting device and the receiving device without requiring a phase lock between the clock signal Fa and the clock signal Fb2; wherein the first PLL circuit further includes:

a VCO adapted to generate the clock signal Fak;

a first divider coupled to receive the clock signal Fak and divide the clock signal Fak by the factor K to produce the clock signal Fb1; and a first PLL having a variable input and a reference input, the first PLL coupled to receive the clock signal Fa at its reference input and coupled to receive the clock signal Fb1 at its variable input, the first PLL operable to control the VCO to achieve a frequency lock between the clock signal Fa and the clock signal Fb1.

9. The system of claim 8, wherein the second PLL circuit further includes:

a voltage controlled crystal oscillate (VCXO) adapted to generate the clock signal Fbn;

a second divider coupled to receive the clock signal Fbn and divide the clock signal Fbn by the factor L to produce the clock signal Fbk;

a second PLL having a variable input and a reference input, the second PLL coupled to receive the clock signal Fak at its reference input and coupled to receive the clock signal Fbk at its variable input, the second PLL operable to control the VCXO to achieve a phase lock between the clock signal Fbk and the clock signal Fak; and a third divider coupled to receive the clock signal Fbn and divide the clock signal Fbn by the factor N to produce the clock signal Fb2.

10. The system of claim 9, wherein the clock synchronization system uses values for the factors K, L, and N, such that the clock signal Fa multiplied by K multiplied by L, is equal to the clock signal Fak multiplied by L, which is equal to the clock signal Fb2.

11. The system of claim 9, wherein the first PLL is configured to have a wide tuning range and to achieve a fast phase lock.

12. The system of claim 9, wherein the second PLL is configured to have a narrow tuning range and to achieve a precise phase lock between the clock signals Fak and Fbk.

13. The system of claim 9, wherein the VCXO is operable to produce the clock signal Fbn such that the clock signal Fbn has a nominal frequency within proscribed DECT (digital enhanced cordless telephony) specifications.

14. In a digital communications system, a method for rapidly achieving synchronization between a first communications device and a second communications device to enable digital communication there between, the method comprising the steps of:

generating a clock signal Fa using a transmitting device;

generating a second clock signal Fb2 using a receiving device;

increasing the clock signal Fa by a factor K to produce the clock signal Fak by using a first phase locked loop (PLL) circuit;

increasing the clock signal Fak by a factor L to produce a clock signal Fbn by using a second PLL circuit;

decreasing the clock signal Fbn by a factor N to produce a clock signal Fb2 by using the second PLL circuit;

adjusting the values of the factors K, L, and N such that a frequency lock is achieved between the clock signal Fa and the clock signal Fb2 without requiring a phase lock between the clock signal Fa and the clock signal Fb2; and using the clock signal Fb2 to sample a data stream received by the receiving device from the transmitting device; wherein the first PLL circuit includes a first PLL having a wide tuning range and adapted to achieve a fast frequency lock.

15. The method of claim 14, wherein the second PLL circuit includes a second PLL having a narrow tuning range and adapted to achieve a phase lock between the clock signals Fak and Fbk.

16. The method of claim 15, wherein the first PLL is cascaded with the second PLL to step up clock signal Fa to an intermediate clock signal Fak using the first PLL and achieve phase and frequency lock on the clock signal Fak using the second PLL, the first PLL further operable as an agile, wide-range PLL, the second PLL further operable as a stable, narrow-range PLL.

17. The method of claim 15, wherein the second PLL circuit includes a voltage controlled crystal oscillate (VCXO) operable to produce the clock signal Fbn, wherein the VCXO is configured to have a nominal frequency for the clock signal Fbn within proscribed DECT (digital enhanced cordless telephony) specifications.

* * * * *